United States Patent
Lu

(10) Patent No.: US 11,296,002 B2
(45) Date of Patent: Apr. 5, 2022

(54) SEMICONDUCTOR DEVICE PACKAGE AND METHOD FOR MANUFACTURING THE SAME

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/734,023

(22) Filed: Jan. 3, 2020

(65) Prior Publication Data

US 2021/0210398 A1 Jul. 8, 2021

(51) Int. Cl.
*H01L 23/31* (2006.01)
*H01L 23/66* (2006.01)
*H01L 21/56* (2006.01)
*H01L 23/00* (2006.01)

(52) U.S. Cl.
CPC ........ *H01L 23/3121* (2013.01); *H01L 21/565* (2013.01); *H01L 23/66* (2013.01); *H01L 24/45* (2013.01); *H01L 2223/6677* (2013.01)

(58) Field of Classification Search
CPC .................. H01L 23/3135; H01L 25/0655
See application file for complete search history.

(56) References Cited

U.S. PATENT DOCUMENTS

| 7,369,090 B1 * | 5/2008 | Beard | H01Q 1/242 257/734 |
|---|---|---|---|
| 2014/0367840 A1 * | 12/2014 | Eu | H01L 23/3128 257/692 |
| 2017/0040304 A1 * | 2/2017 | Shih | H01L 25/16 |

\* cited by examiner

*Primary Examiner* — Yu-Hsi D Sun
(74) *Attorney, Agent, or Firm* — Foley & Lardner LLP

(57) ABSTRACT

A semiconductor device package includes a substrate, a first electronic component and a first encapsulant. The substrate has a first surface and a second surface opposite to the first surface. The first electronic component is disposed on the first surface of the substrate. The first encapsulant is disposed on the first surface of the substrate and covers the first electronic component. The first encapsulant has a first surface facing away the first surface of the substrate and includes a recess at an edge of the first surface of the first encapsulant.

18 Claims, 25 Drawing Sheets

SEMICONDUCTOR DEVICE PACKAGE AND METHOD FOR MANUFACTURING THE SAME

BACKGROUND

1. Technical Field

The present disclosure relates to a semiconductor device package and a method for manufacturing the same, and to a semiconductor package including at least one semiconductor device (or electronic component) surrounded by an encapsulant.

2. Description of the Related Art

A semiconductor device package may include a plurality of semiconductor devices (or electronic components) surrounded by an encapsulant. The encapsulant may be formed by a molding process. However, the molding process may result in the following defects: (a) since the mold directly contacts the substrate, the traces on the substrate may be damaged by the mold, and therefore, a spare surface area may be specified for the mold; (b) the electronic component may be cracked or damaged by the disposal and removal of the mold; and (c) a portion of the surface of the substrate is covered by the encapsulant since a draft angle is specified for removing the mold, which wastes a portion of the substrate's surface by making it unusable.

SUMMARY

In accordance with some embodiments of the present disclosure, a semiconductor device package includes a substrate, a first electronic component and a first encapsulant. The substrate has a first surface and a second surface opposite to the first surface. The first electronic component is disposed on the first surface of the substrate. The first encapsulant is disposed on the first surface of the substrate and covers the first electronic component. The first encapsulant has a first surface facing away the first surface of the substrate and includes a recess at an edge of the first surface of the first encapsulant.

In accordance with some embodiments of the present disclosure, a method for manufacturing a semiconductor device package includes providing a substrate having a first surface and a second surface opposite to the first surface; disposing a first electronic component in a first region of the first surface of the substrate and disposing a removable member in a second region of the first surface of the substrate; forming a first encapsulant in the first region of the first surface of the substrate to cover the first electronic component; lowering a temperature of the removable member; and removing the removable member from the substrate.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Figure 1:
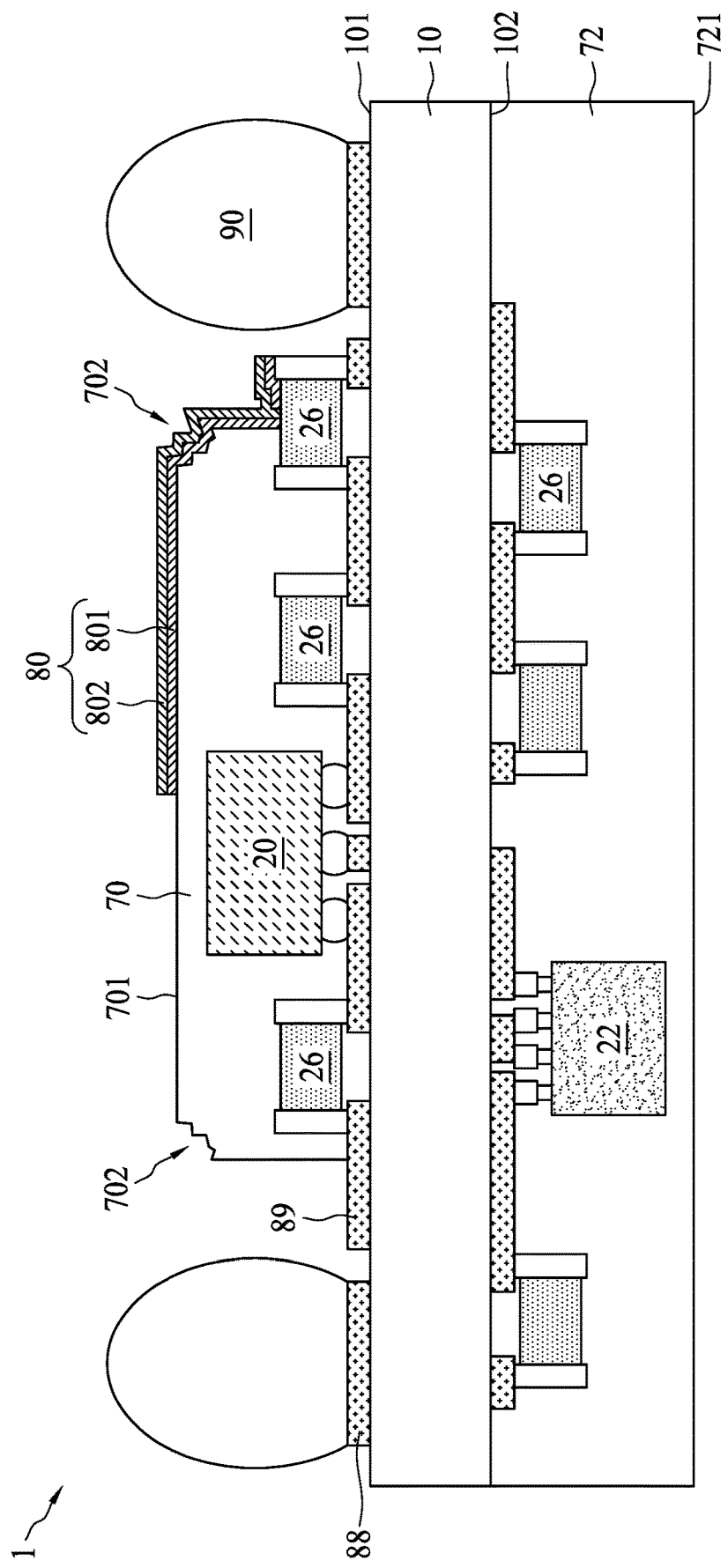
FIG. 1 illustrates a cross section of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

Various embodiments of the present disclosure are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and not intended to be limiting.

Embodiments, or examples, illustrated in the drawings are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross section of a semiconductor device package 1 in accordance with some embodiments of the present disclosure. The semiconductor device package 1 includes a substrate 10, electronic components 20, 22 and 26, encapsulants 70 and 72 and conductive members 90.

The substrate 10 has a first surface 101 and a second surface 102 opposite to the first surface 101. The substrate 10 may include a semiconductor material, glass, a polymer (e.g., polypropylene (PP)), a resin (e.g., Bismaleimide-triazine (BT) resin or a glass-reinforced epoxy resin like FR-4 resin), a copper clad laminate (CCL) substrate or another suitable material to support components thereon.

The semiconductor device package 1 may include a patterned conductive layer formed on the first surface 101 of the substrate 10 or a second surface 102 of the substrate 10. The patterned conductive layer may include conductive trace(s), pad(s), or contact(s) (e.g., 88 and 89 in FIG. 1). The patterned conductive layer may be made of, for example, copper (Cu), another metal, an alloy, or other suitable conductive materials.

The semiconductor device package 1 may include an electronic component 20 or 26 disposed on the first surface 101 of the substrate 10 and an electronic component 22 or 26 is disposed on the second surface 102 of the substrate 10. In some embodiments, the electronic components 20 and 22 may include an active chip or die. In some embodiments, the electronic component 26 may include a passive component (such as an inductor or capacitor). In some embodiments, the electronic components 20, 22 or 26 may be in contact with the patterned conductive layer.

The encapsulant 70 is disposed on the first surface 101 of the substrate 10. The encapsulant 70 covers the electronic components 20 and 26. The encapsulant 70 has a first surface 701 facing away the first surface 101 of the substrate 10. The encapsulant 70 includes a recess 702 at an edge of the first surface 701 of the encapsulant 70. In some embodiments, the encapsulant 70 may partially cover one or more electronic components (e.g., the electronic component 26 shown in FIG. 1). The encapsulant 70 is disposed on a first region of the first surface 101 of the substrate 10.

In some embodiments, an encapsulant 72 is disposed on the second surface 102 of the substrate 10 and covers the electronic components 22 and 26 disposed on the second surface 102 of the substrate 10. In the embodiments illustrated in FIG. 1, the encapsulant 72 does not have a recess at an edge of the first surface 721 of the encapsulant 72 while in some other embodiments, the encapsulant 72 may have a recess at an edge of the first surface 721 of the encapsulant 72.

In some embodiments, a conductive wire 80 or a patterned conductive layer 80 is disposed on the first surface 701 of the encapsulant 70 and extends along the recess 702 to a lateral surface of the encapsulant 70. In some embodiments, the recess 702 may be recessed from the first surface 701 of the encapsulant 70 or the lateral surface of the encapsulant 70, or both. In some embodiments, the recess is a concave recess. In some embodiments, the recess has a surface roughness (Ra) ranging from 0.5 µm to 10 µm, for example, 0.5 µm, 0.6 µm, 0.8 µm, 1 µm, 2 µm, 3 µm, 4 µm, 5 µm, 6 µm, 7 µm, 8 µm, 9 µm, or 10 µm. In some embodiments, the recess has a curvature radius ranging from 5 µm to 55 µm, for example, 5 µm, 8 µm, 10 µm, 15 µm, 20 µm, 25 µm, 30 µm, 35 µm, 40 µm, 45 µm, 50 µm, or 55 µm.

The conductive wire 80 or a patterned conductive layer 80 may be electrically connected to the electronic component(s) disposed on the first surface 101 of the substrate 10, e.g., the electronic component 26. In some embodiments, the electronic component 26 may be electrically connected to a further electronic component (such as an antenna; not shown) through the conductive wire 80 or the patterned conductive layer 80. In some embodiments, the conductive wire 80 or the patterned conductive layer 80 contacts a top surface of the electronic component 26. The conductive wire 80 or the patterned conductive layer 80 may be, for example, copper (Cu), another metal, an alloy, or other suitable conductive materials.

In some embodiments, the conductive wire 80 or the patterned conductive layer 80 may include a patterned seed layer 801 and a patterned conductive layer 802.

In some embodiments, a conductive member 90 is disposed on a second region of the first surface 101 of the substrate 10 and not covered by the encapsulant 70. In some embodiments, an electronic component (not shown) is disposed on a second region of the first surface 101 of the substrate 10 and not covered by the encapsulant 70. In some embodiments, the conductive member 90 may include a solder ball or bump. In some embodiments, the conductive members 90 are formed on the patterned conductive layer 88.

Figure 2:
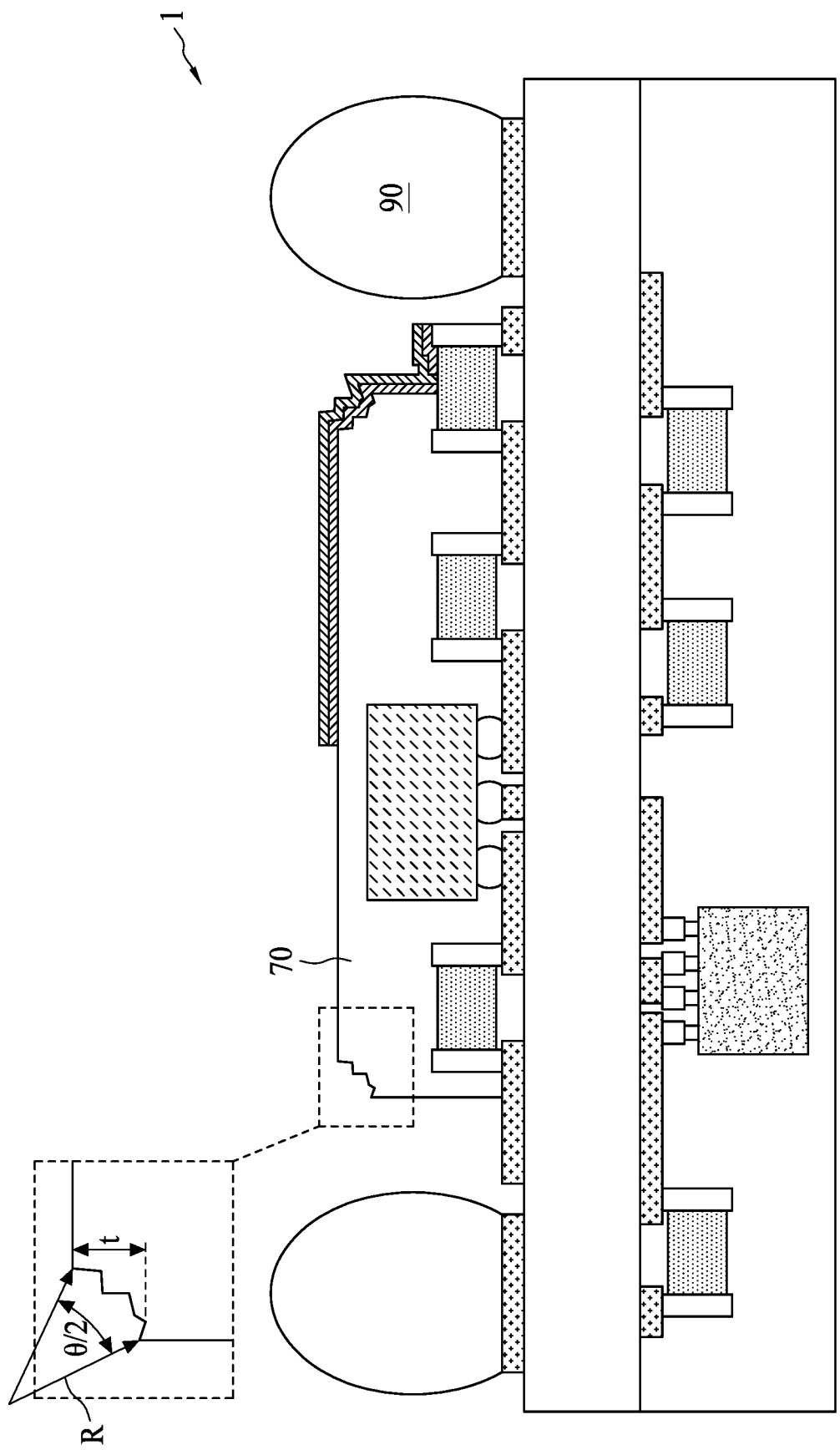
FIG. 2 illustrates a cross section of a semiconductor device package in accordance with some embodiments of the present disclosure.

FIG. 2 illustrates an enlarged view of the recess 702 of a semiconductor device package 1 in accordance with some embodiments of the present disclosure. As described above, the recess 702 has a curvature radius R ranging from 5 µm to 55 µm. The angle θ is approximately 30° to 90°. The thickness t is approximately 5 µm to 20 µm. The presence of the recess 702 increases the contact surface area between the conductive wire or patterned conductive layer 80 and the encapsulant 70, and therefore, the adhesion between the conductive wire or patterned conductive layer 80 and the encapsulant 70 can be further enhanced. In addition, the roughness of the recess 702 also increases the contact surface area between the conductive wire or patterned conductive layer 80 and the encapsulant 70 and enhances the adhesion therebetween.

In some embodiments, an angle between the first surface 701 of the encapsulant 70 and a lateral surface of the encapsulant 70 is a right angle or an acute angle. In some embodiments, an angle between the first surface 701 of the encapsulant 70 and a lateral surface of the encapsulant 70 is an obtuse angle.

Figure 3A:
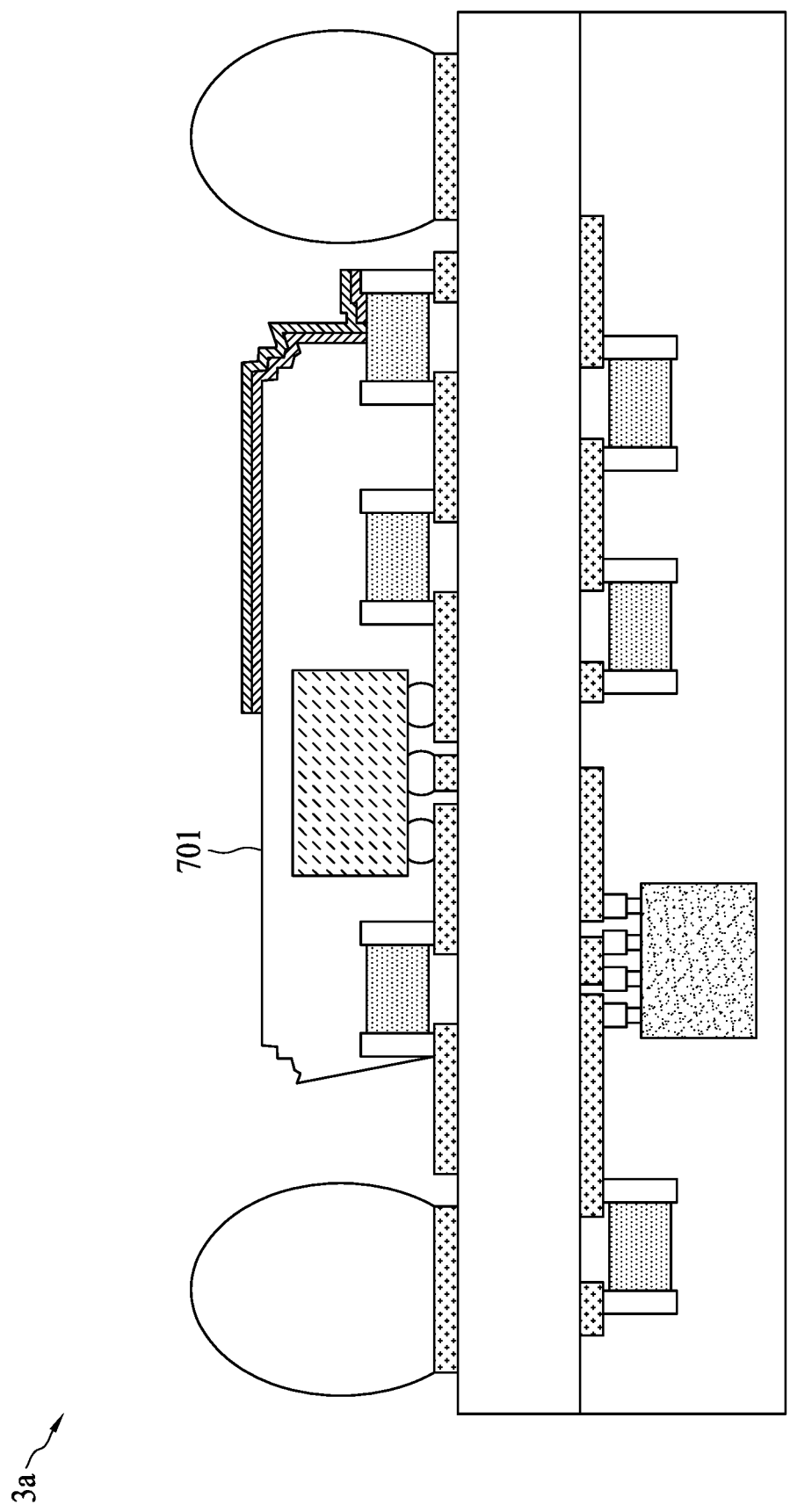
FIG. 3A and FIG. 3B illustrate a cross section of semiconductor device packages in accordance with some embodiments of the present disclosure.
Figure 3B:
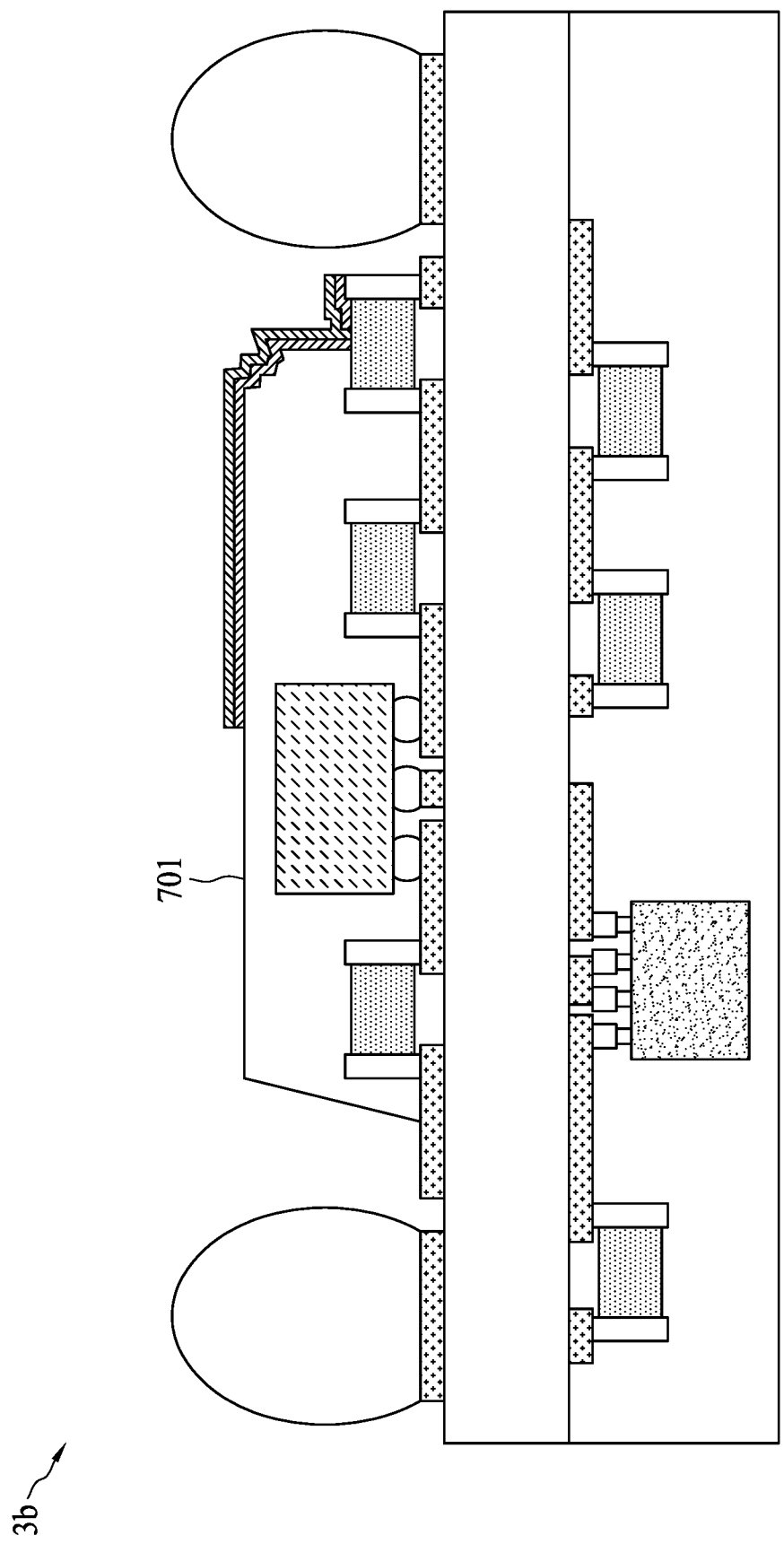

FIGS. 3A and 3B illustrate semiconductor device packages 3a and 3b in accordance with some embodiments of the present disclosure. The semiconductor device packages 3a and 3b are similar to the semiconductor device package 1. In the embodiments shown in FIG. 3A, an angle between the first surface 701 of the encapsulant 70 and a lateral surface of the encapsulant 70 may be an acute angle. In the embodiments shown in FIG. 3B, an angle between the first surface 701 of the encapsulant 70 and a lateral surface of the encapsulant 70 may be an obtuse angle. In some other embodiments, an angle between the first surface 701 of the encapsulant 70 and a lateral surface of the encapsulant 70 may be a right angle as shown in FIG. 1.

Figure 4:
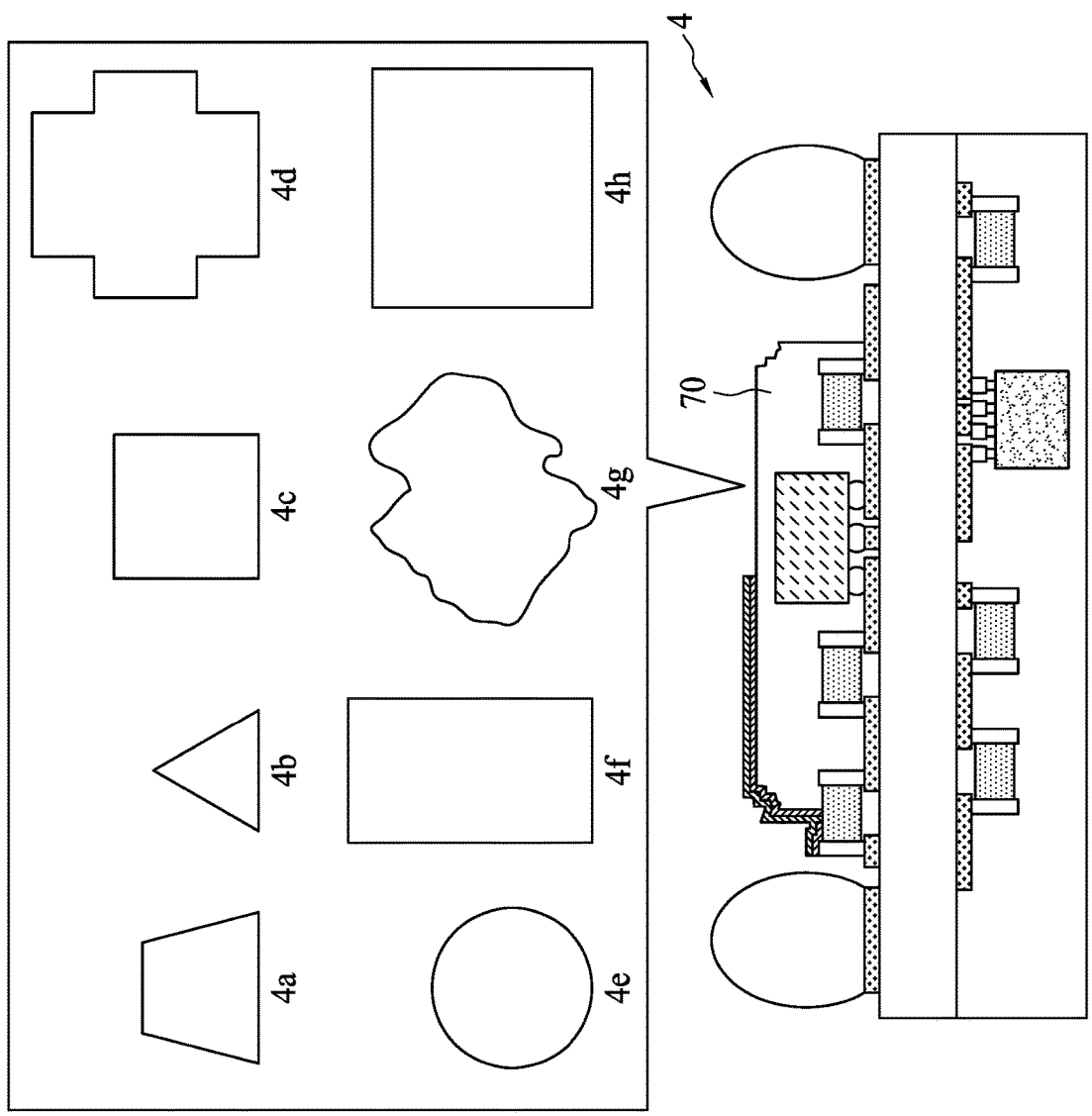
FIG. 4 illustrates a cross section of a semiconductor device package in accordance with some embodiments of the present disclosure.

FIG. 4 illustrates a semiconductor device package 4 in accordance with some embodiments of the present disclosure. The semiconductor device package 4 is similar to the semiconductor device package 1. The top view of the encapsulants 70 of the semiconductor device package 4 may include various shapes as shown in 4a-4h.

Figure 5A:
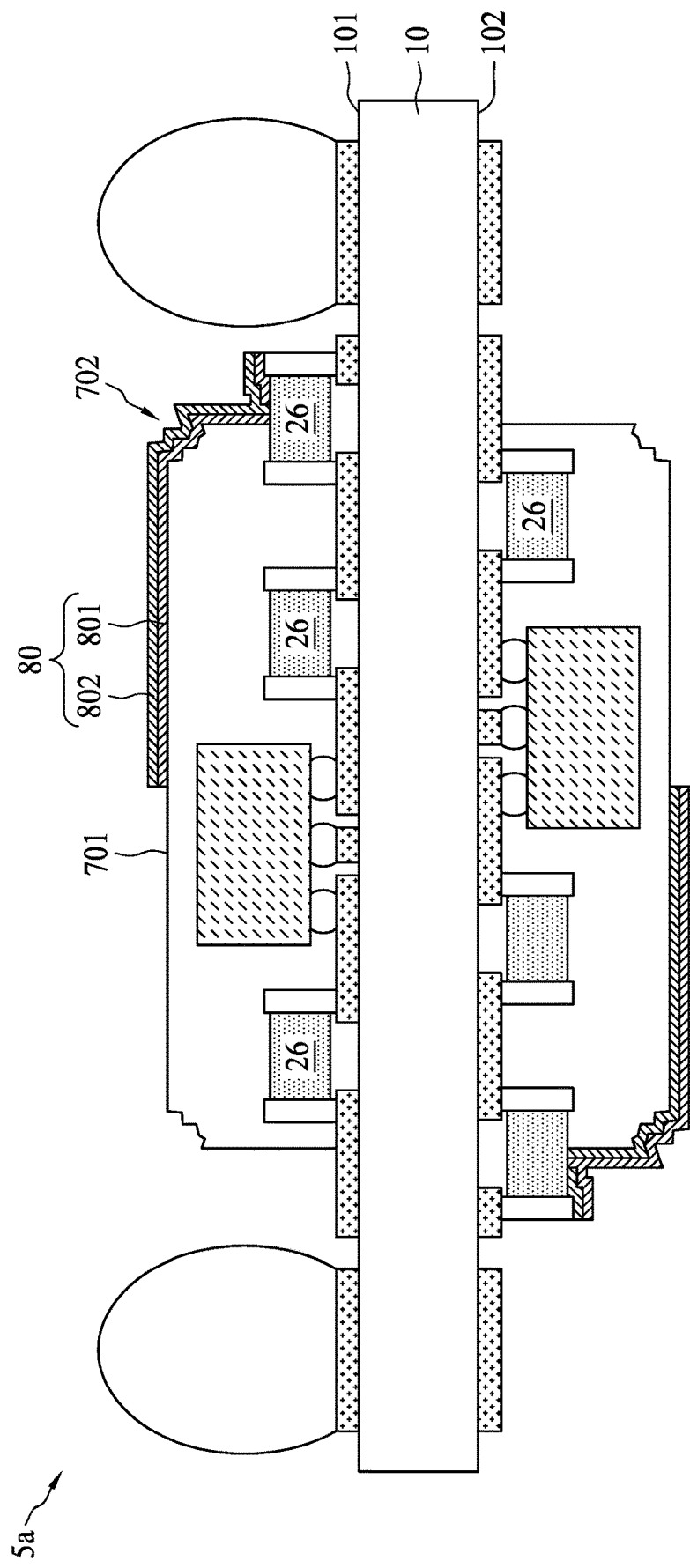
FIG. 5A, FIGS. 5B, and 5C illustrate a cross section of semiconductor device packages in accordance with some embodiments of the present disclosure.
Figure 5B:
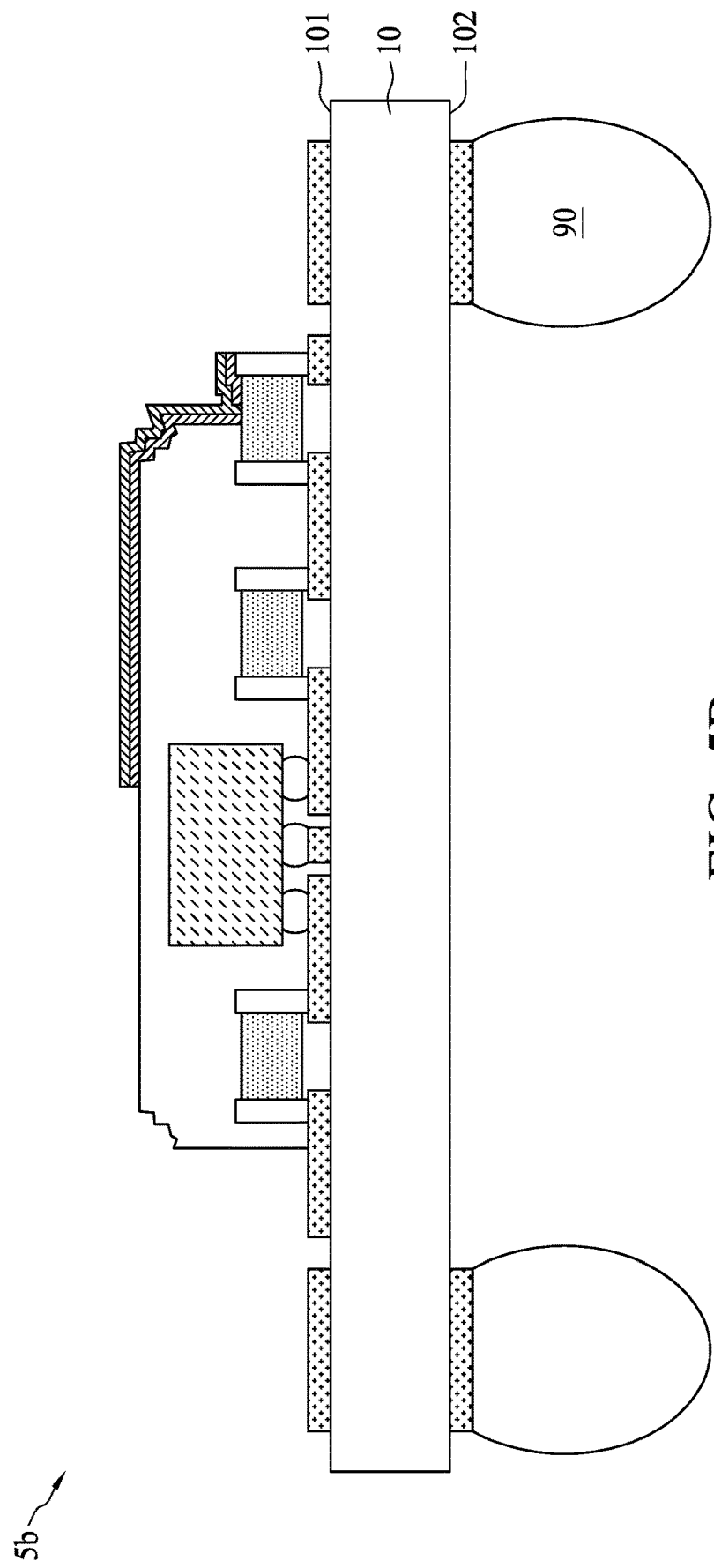
Figure 5C:
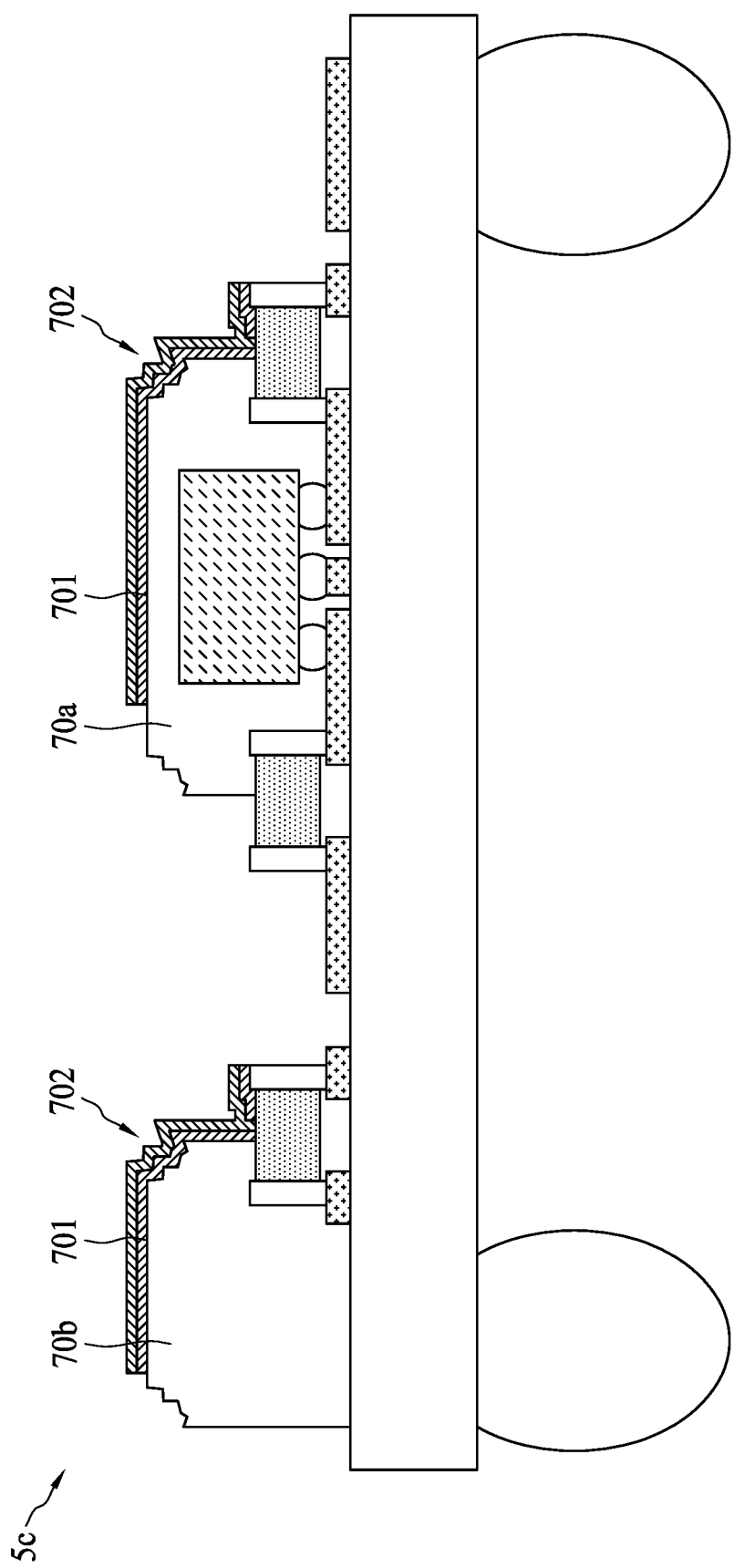

FIGS. 5A to 5C illustrate semiconductor device packages 5a to 5c in accordance with some embodiments of the present disclosure. The semiconductor device packages 5a to 5c are similar to the semiconductor device package 1.

Referring to FIG. 5A, the conductive wire 80 or patterned conductive layer 80 is disposed on the first surface 701 of the encapsulant 70, extends along the recess 702 to a lateral surface of the encapsulant 70 and then contacts a top surface of the electronic component 26. Such structure can be formed on the first surface 101 of the substrate 10, the second surface 102 of the substrate 10, or both as illustrated in FIG. 5A.

Referring to FIG. 5B, the semiconductor device package 5b is similar to the semiconductor device package 1 except that the conductive member 90 is disposed on the second surface 102 of the substrate 10 and in contact with a pad on the second surface 102 of the substrate 10.

Referring to FIG. 5C, the semiconductor device package 5c may include one or more encapsulants 70a and 70b having a recess 702 at an edge of the first surface 701 of the encapsulants.

Figure 6A:
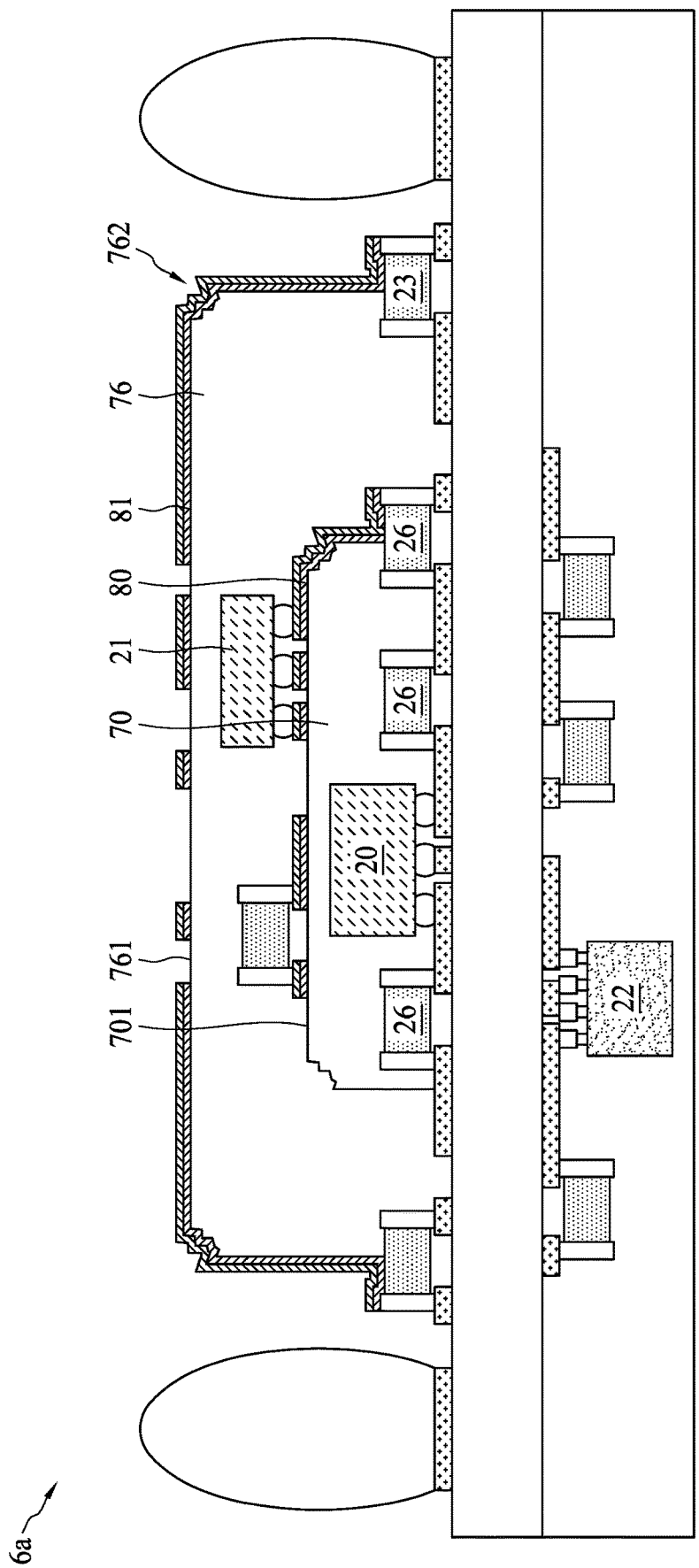
FIG. 6A and FIG. 6B illustrate a cross section of semiconductor device packages in accordance with some embodiments of the present disclosure.
Figure 6B:
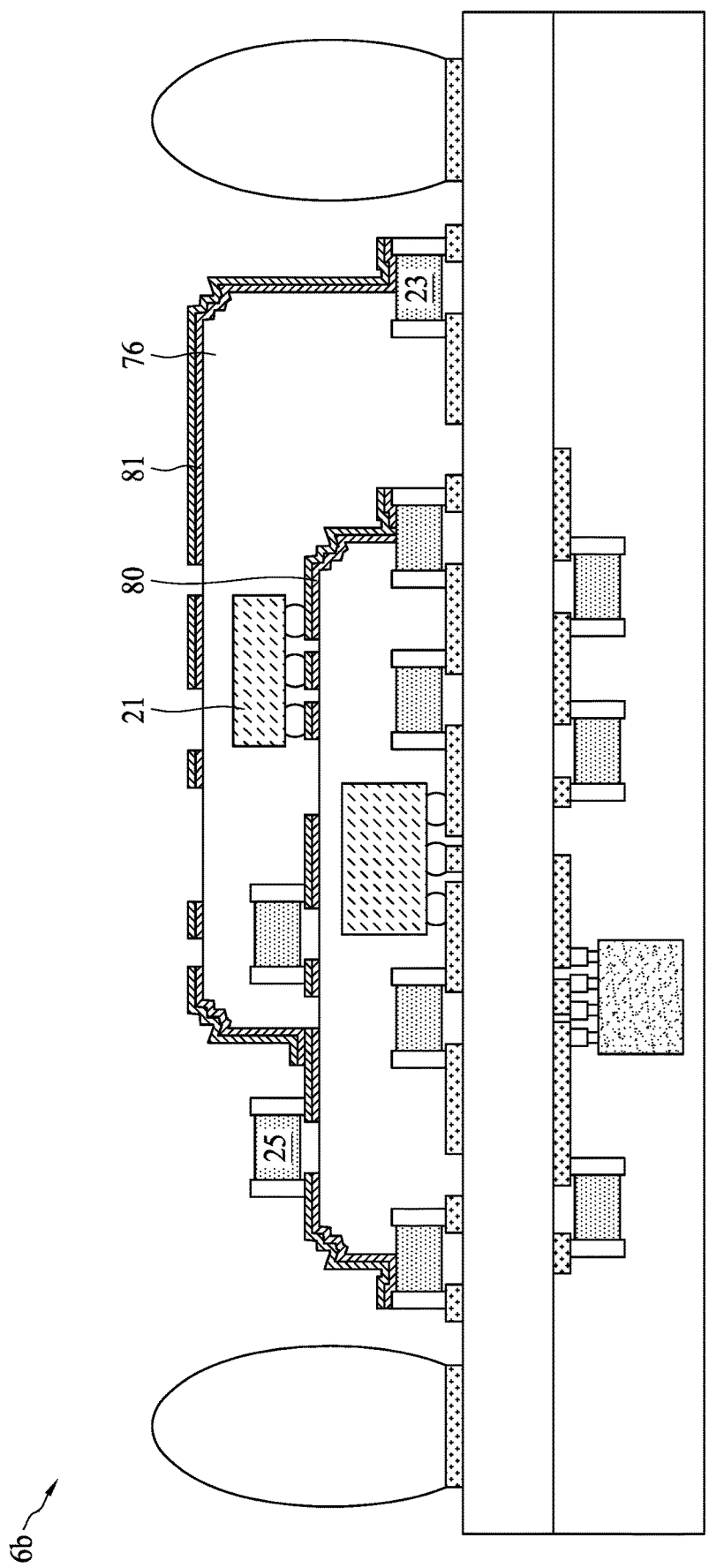

FIGS. 6A and 6B illustrate semiconductor device packages 6a and 6b in accordance with some embodiments of the present disclosure.

Referring to FIG. 6A, the semiconductor device package 6a is similar to the semiconductor device package 1. The semiconductor device package 6a further comprises electronic components 21 and 23, an encapsulant 76, and a conductive wire or patterned conductive layer 81. The encapsulant 70 is disposed on the first region of the first surface 101 of the substrate 10 and covers the electronic components 20 and 26. The electronic component 21 is disposed on the first surface 701 of the encapsulant 70. The electronic component 23 is disposed on the first surface 101 of the substrate 10 but outside the first region of the first surface 101 (e.g., not covered by the encapsulant 70). The encapsulant 76 is disposed on the first surface 701 of the encapsulant 70 and covers the encapsulant 70 and the electronic component 21. The encapsulant 76 partially covers the electronic component 23. The encapsulant 76 may have a recess 762 at an edge of the first surface 761 of the encapsulant 76. The conductive wire or patterned conductive layer 81 may be disposed on a first surface 761 of the encapsulant 70 and extends along the recess 762 to a lateral surface of the encapsulant 70. In some embodiments, the conductive wire or patterned conductive layer 80 or 81 may extend both to the left and right lateral surface of the encapsulant 70.

Referring to FIG. 6B, the semiconductor device package 6b is similar to the semiconductor device package 6a except that the encapsulant 76 partially covers the encapsulant 70. A portion of the first surface 701 of the encapsulant 70 is exposed and a further electronic component 25 may be disposed on the exposed portion. The electronic component 25 may be electrically connected to the conductive wire or patterned conductive layer 80, the conductive wire or patterned conductive layer 81, or both.

Figure 7:
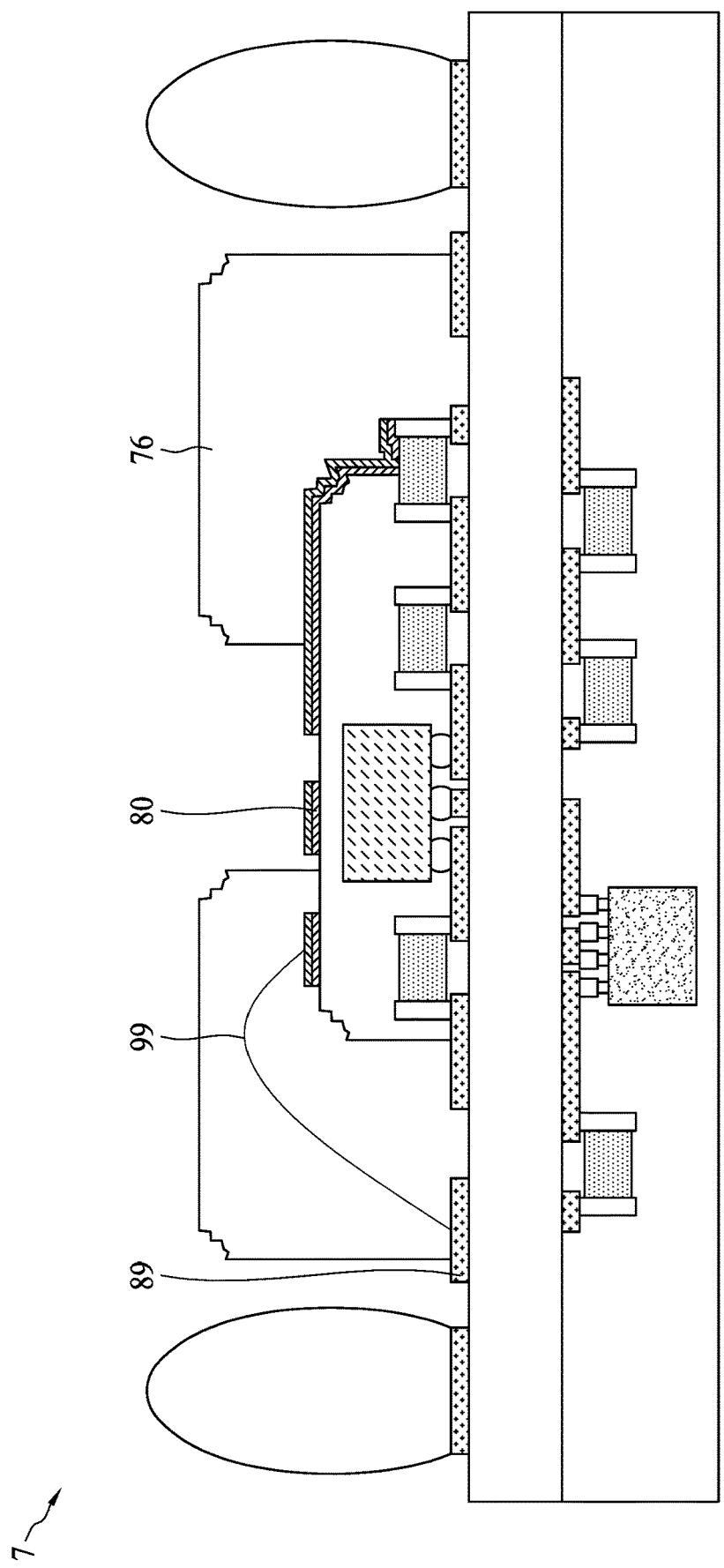
FIG. 7 illustrates a cross section of a semiconductor device package in accordance with some embodiments of the present disclosure.

FIG. 7 illustrates a semiconductor device package 7 in accordance with some embodiments of the present disclosure. The semiconductor device package 7 is similar to the semiconductor device package 1. An encapsulant 76 is formed on the encapsulant 70. The encapsulant 76 covers a portion of the conductive wire 80 or patterned conductive layer 80. The encapsulant 76 covers a conductive wire 99. The conductive wire 99 electrically contacts the conductive wire 80 or patterned conductive layer 80 and the patterned conductive layer 89.

Figure 8A:
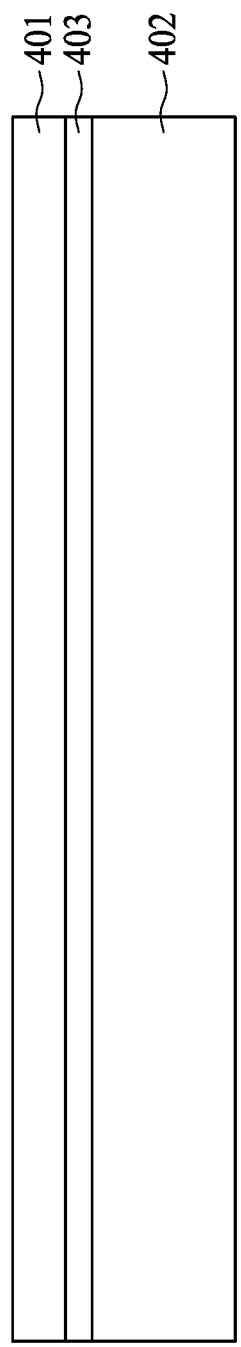
FIG. 8A, FIG. 8B, and FIG. 8C illustrate various stages for manufacturing a removable member in accordance with some embodiments of the present disclosure.
Figure 8B:
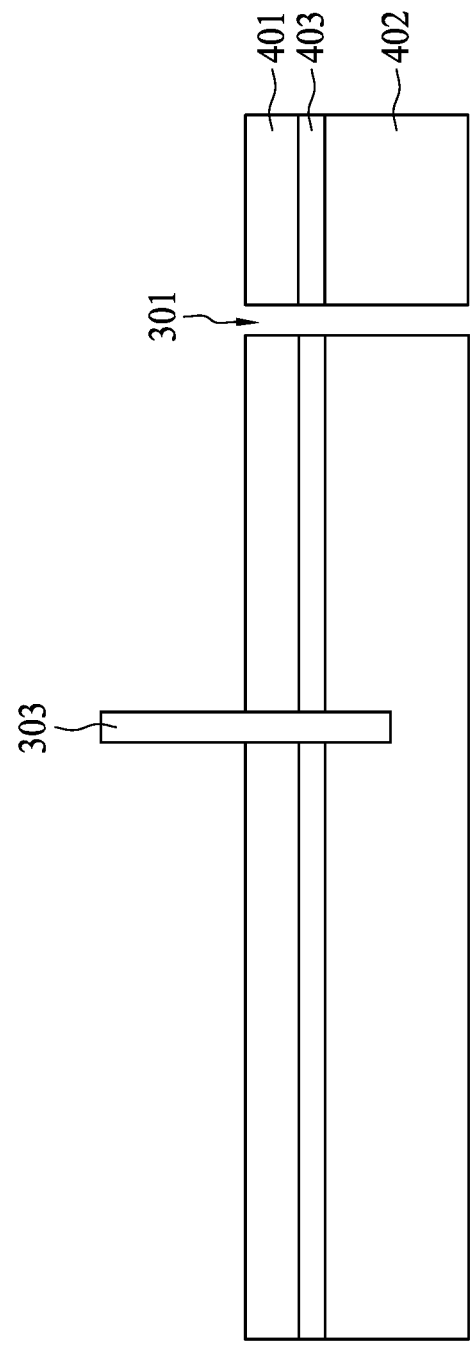
Figure 8C:
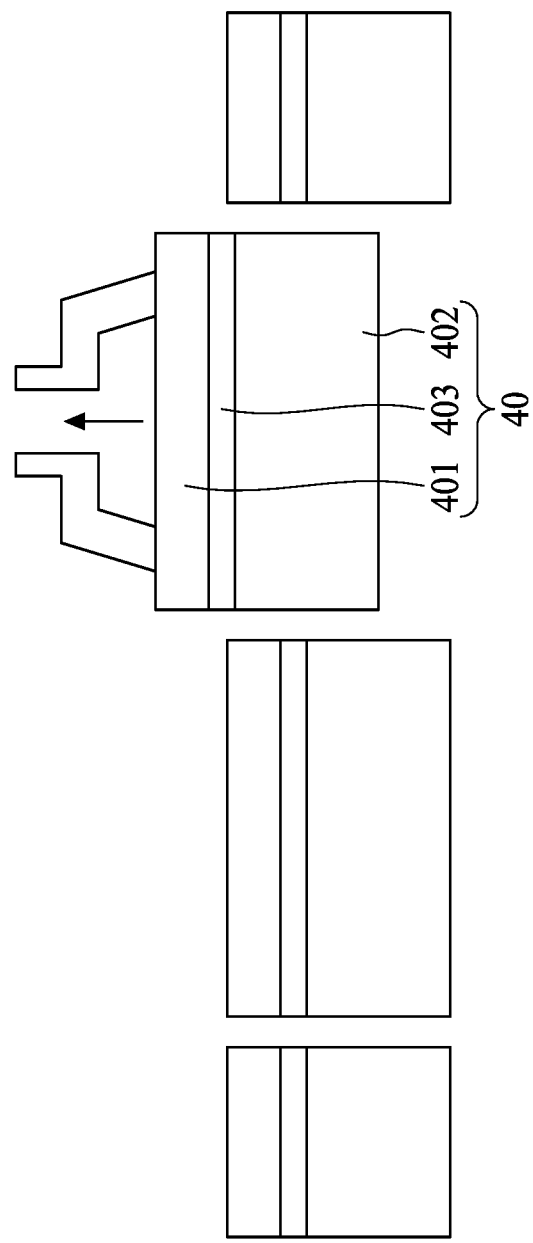

FIGS. 8A-8C illustrate various stages for a method of manufacturing a removable member 40. The removable member 40 can be used for manufacturing the semiconductor device package in accordance with some embodiments of the present disclosure.

Referring to FIG. 8A, a stacked layer structure is provided. The stacked layer structure includes a first material 401 and a second material 402. The first material 401 is stacked on the second material 402. A coefficient of thermal expansion (CTE) of the first material 401 is different from a CTE of the second material 402. In some embodiments, the CTE of the first material 401 is greater than the CTE of the second material 402. In some embodiments, the CTE of the first material 401 is 10 to 50 times the CTE of the second material 402. For example, the CTE of the first material 401 may be 10 times, 15 times, 20 times, 25 times, 30 times, 35 times, 40 times, 42 times or 50 times the CTE of the second material 402.

In some embodiments, an additional layer 403 may be disposed between the first material 401 and the second material 402 to enhance the adhesion therebetween or to facilitate the formation of the first material 401 on the second material 402. The layer 403 may have a CTE close to that of the first material 401 or that of the second material 402.

In some embodiments, the first material 401 may be metal (e.g., copper), the second material 402 may be a polymeric material (e.g., a molding compound), and the layer 403 may be a seed layer.

Referring to FIG. 8B, a singulation operation is carried out by a saw blade 303. The saw blade is used to saw along the scribe lines 301.

Referring to FIG. 8C, after the singulation, the removable member 40 includes a first material 401, a second material 402 and a layer 403 is formed. The removable member 40 may be moved by a vacuum attracting operation.

FIG. 9A to 9J illustrate various stages according to a method for manufacturing the semiconductor device package depicted in FIG. 1.

Figure 9A:
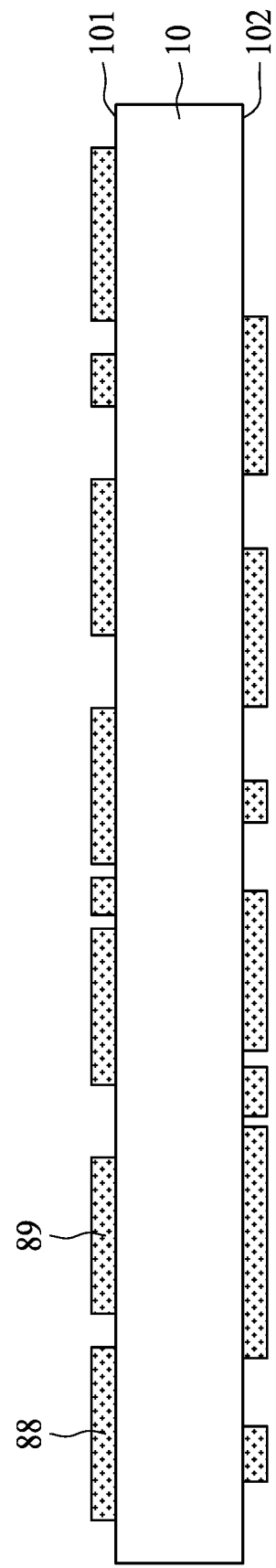
FIG. 9A, FIG. 9B, FIG. 9C, FIG. 9D, FIG. 9E, FIG. 9F, FIG. 9G, FIG. 9H, FIG. 9I, and FIG. 9J illustrate various stages according to a method for manufacturing the semiconductor device package depicted in FIG. 1.

Referring to FIG. 9A, a substrate 10 is provided. Patterned conductive layer 88 and 89 is formed on a first surface 101 and a second surface 102 of the substrate 10, respectively.

Figure 9B:
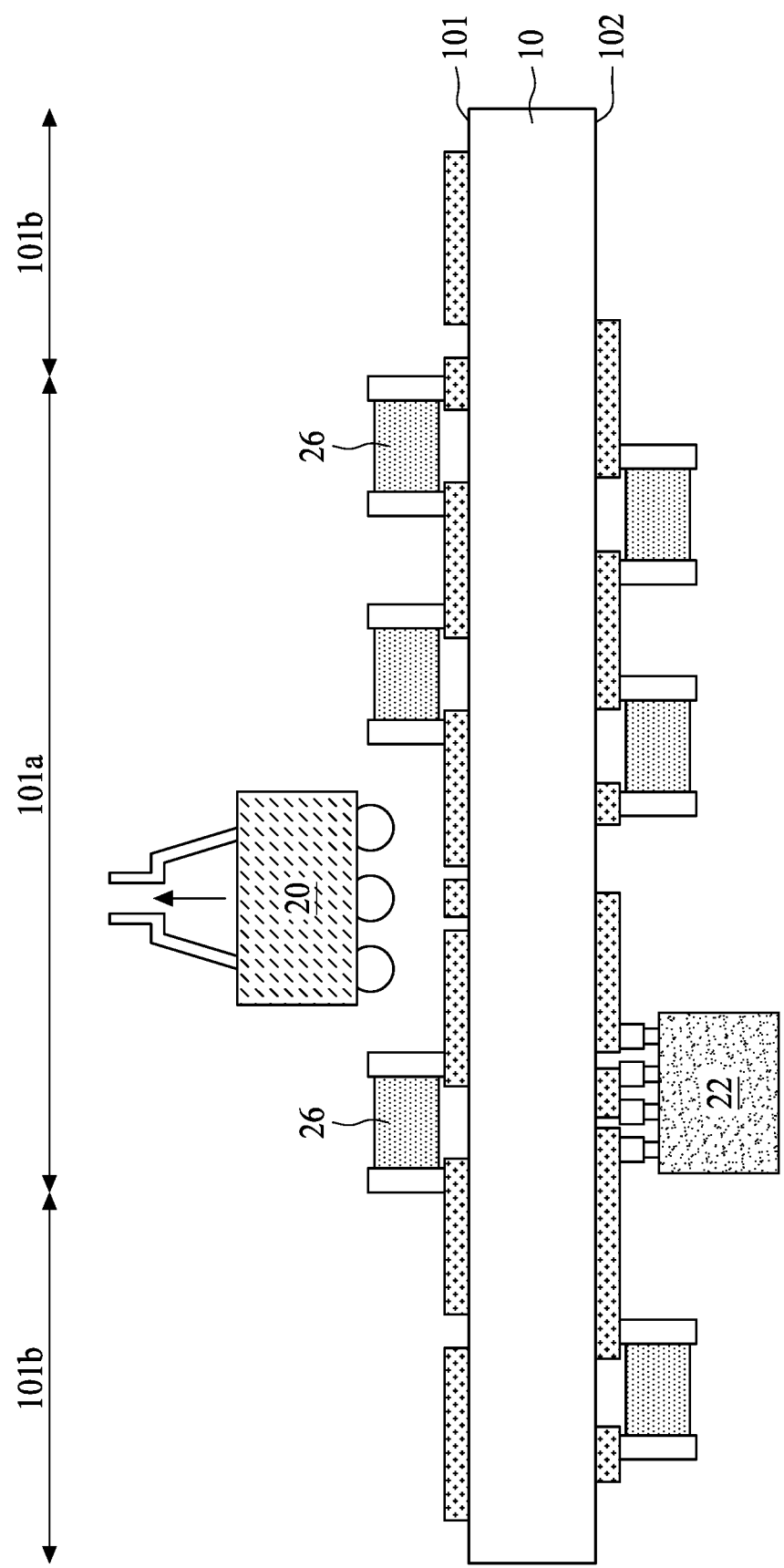

Referring to FIG. 9B, electronic components 20, 22 and 26 are disposed on the patterned conductive layer 89. The electronic component 20 is disposed in a first region 101a of the first surface 101 of the substrate 10 by a vacuum attracting operation. The electronic component 22 is disposed on the second surface 102 of the substrate 10 by a vacuum attracting operation. The electronic component 26 may be disposed on the first surface 101 of the substrate 10 by a vacuum attracting operation in a position where a portion of the electronic component 26 is located in the first region 101a of the first surface 101 and the other portion of the electronic component 26 is located in a second region 101b of the first surface 101.

Figure 9C:
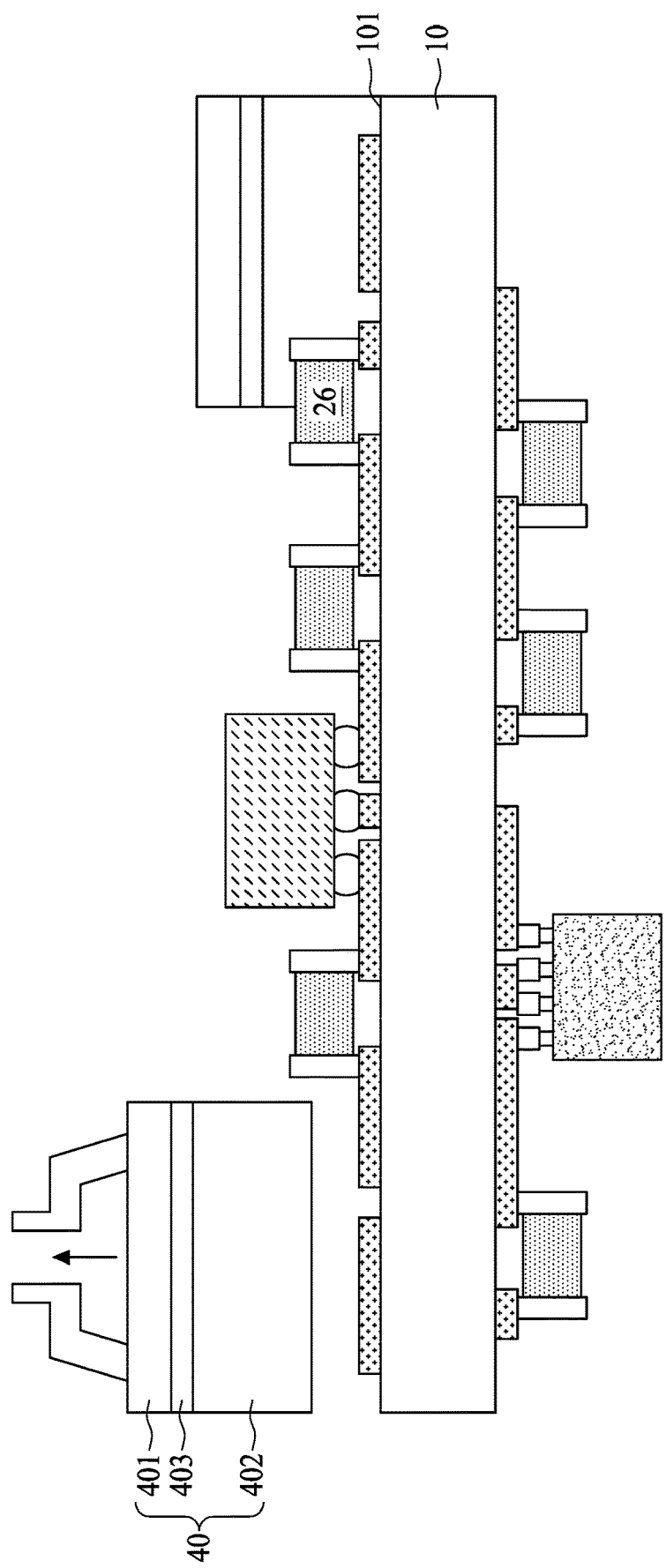

Referring to FIG. 9C, the removable member 40 is disposed in a second region 101b of the first surface 101 of the substrate 10 by a vacuum attracting operation. In some embodiments, the removable member 40 may cover a portion of the electronic component 26 which is located in a second region 101b of the first surface 101.

Figure 9D:
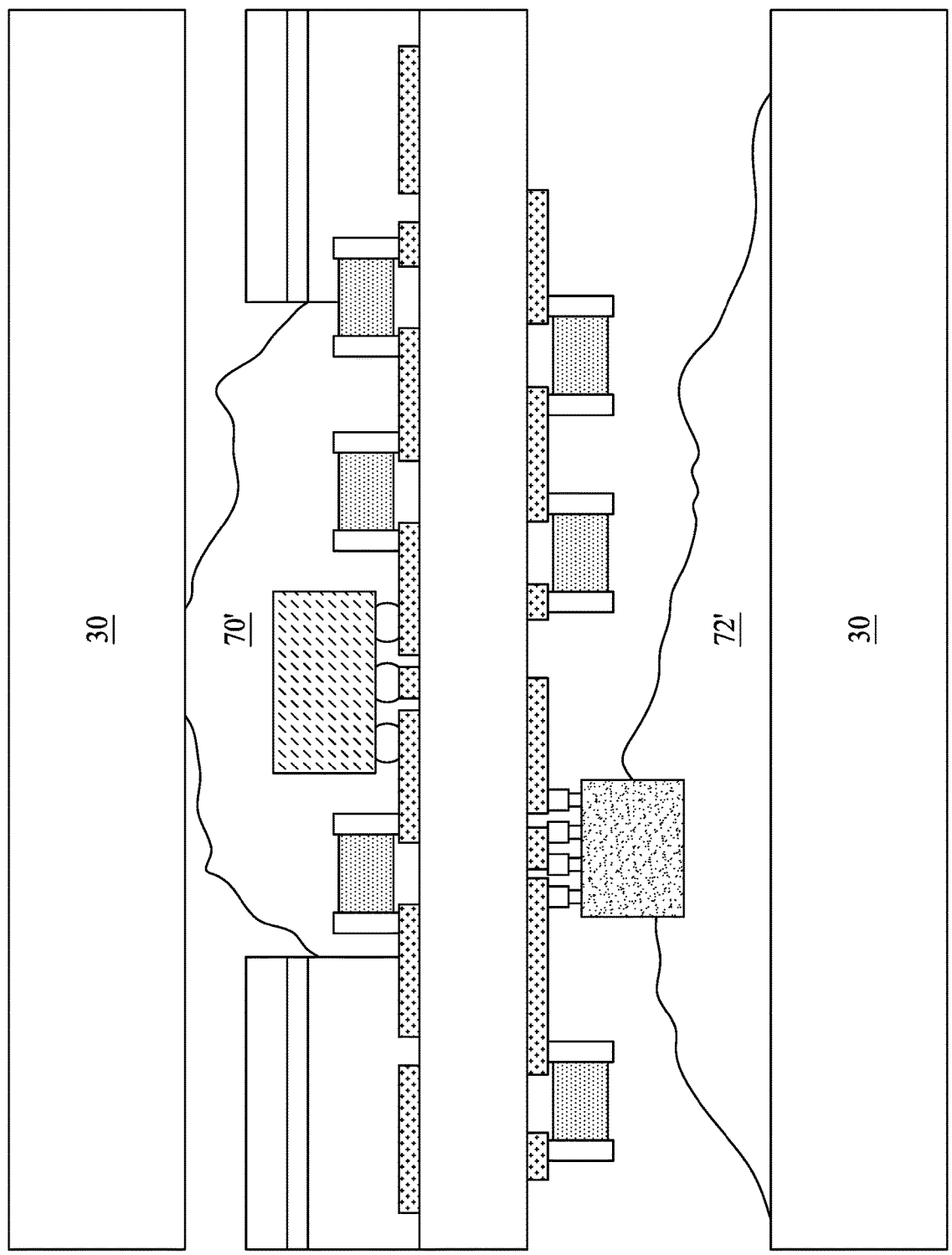

Referring to FIG. 9D, a molding material 70' and molding material 72' is disposed into the mold 30 for carrying out a molding process.

Figure 9E:
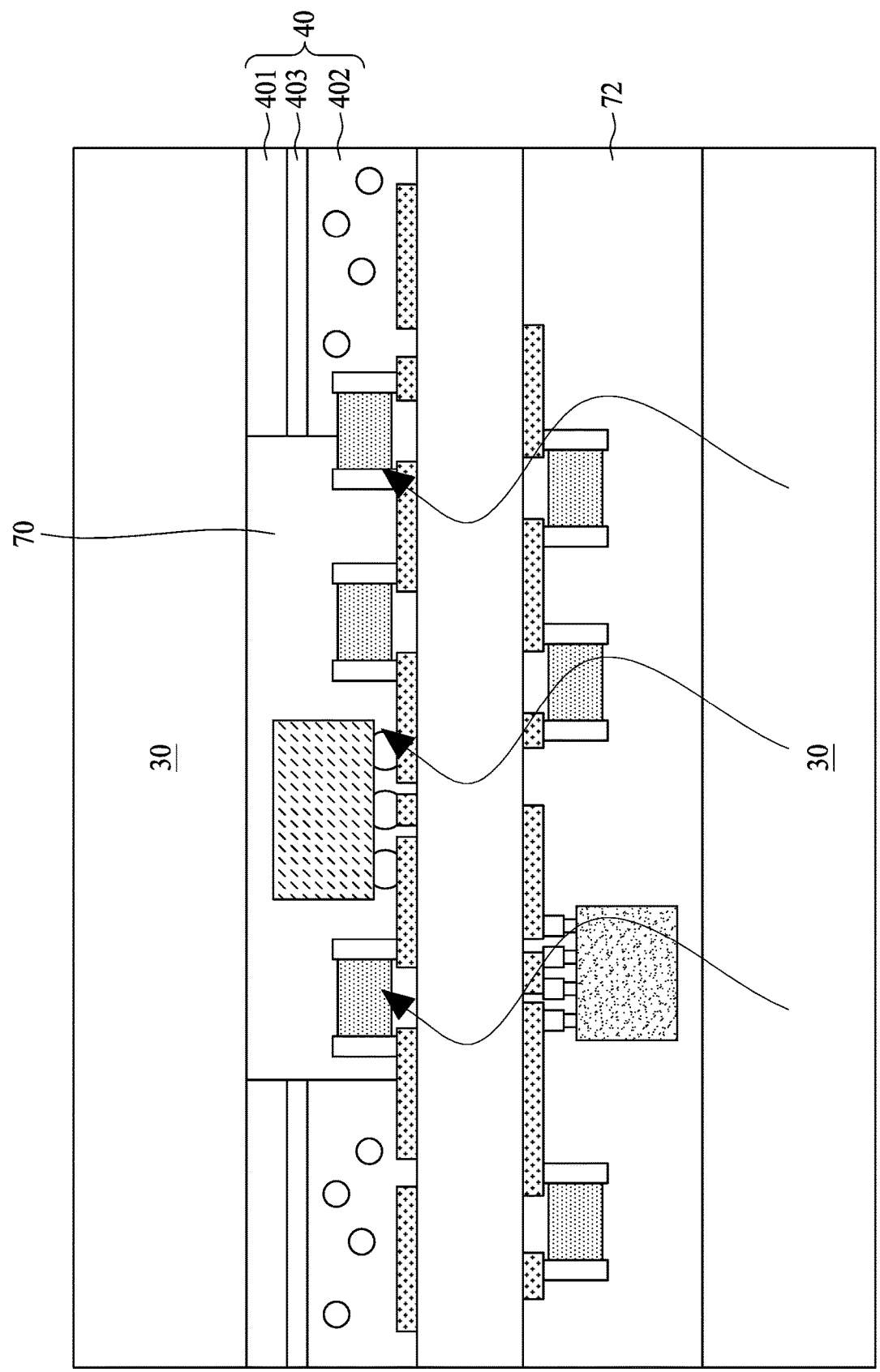

Referring to FIG. 9E, the mold 30 and the molding materials 70' and 72' are heated for curing the molding materials 70' and 72'. After the curing operation, the encapsulants 70 and 72 are formed from the molding materials 70' and 72'. The removable member 40 abuts the encapsulant 70.

In some embodiments, the second material 402 of the removable member 40 is a polymeric material (e.g., a molding compound) which may produce gas during the curing operation so that the second material 402 of the removable member 40 may include some voids after curing.

Figure 9F:
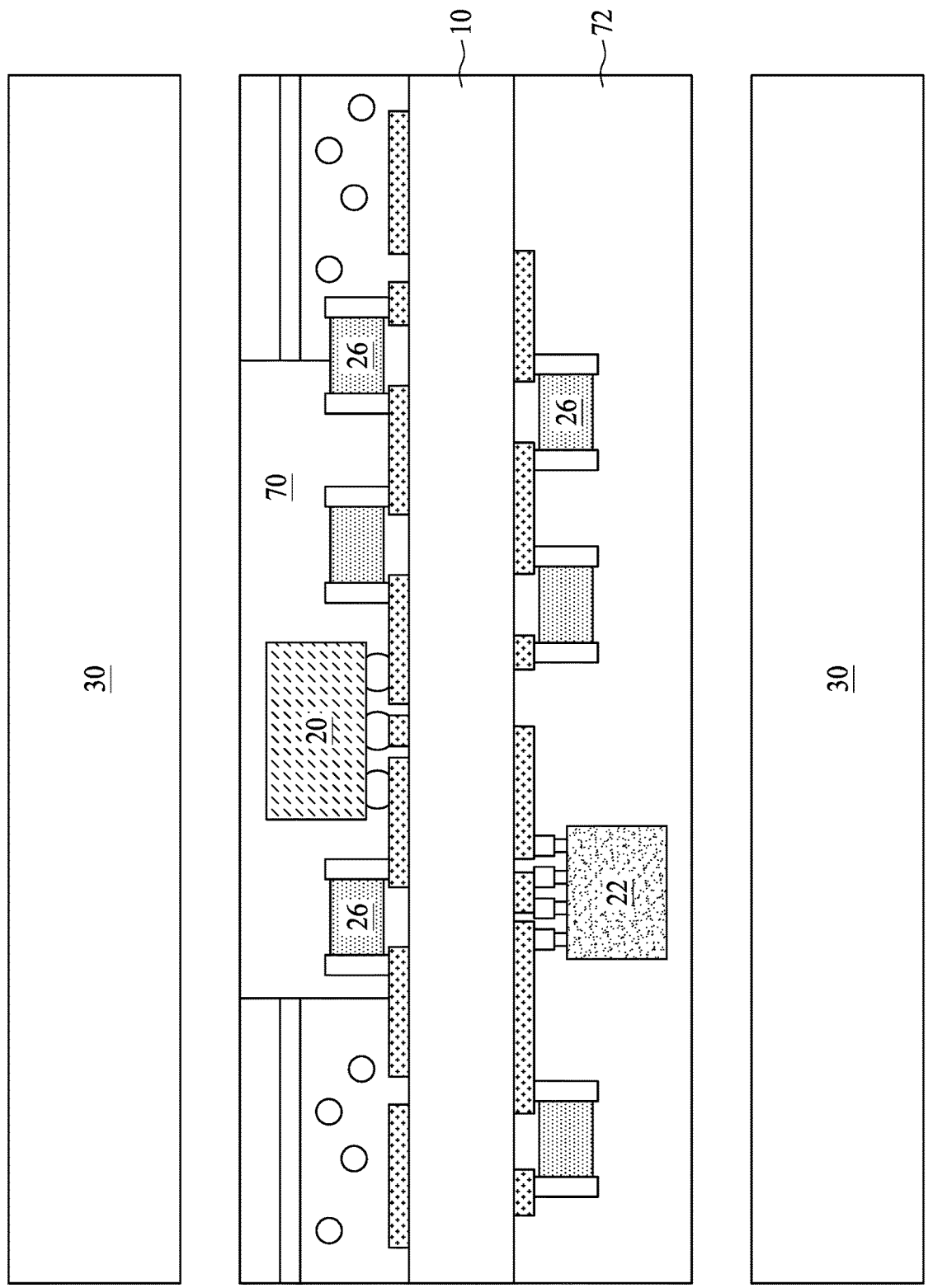

Referring to FIG. 9F, the encapsulant 70 covers and surrounds the electronic components 20 and 26. The encapsulant 72 covers and surrounds the electronic component 22 and 26. In some embodiments, the encapsulant 70 covers a portion of the electronic component 26. The mold 30 is removed.

Figure 9G:
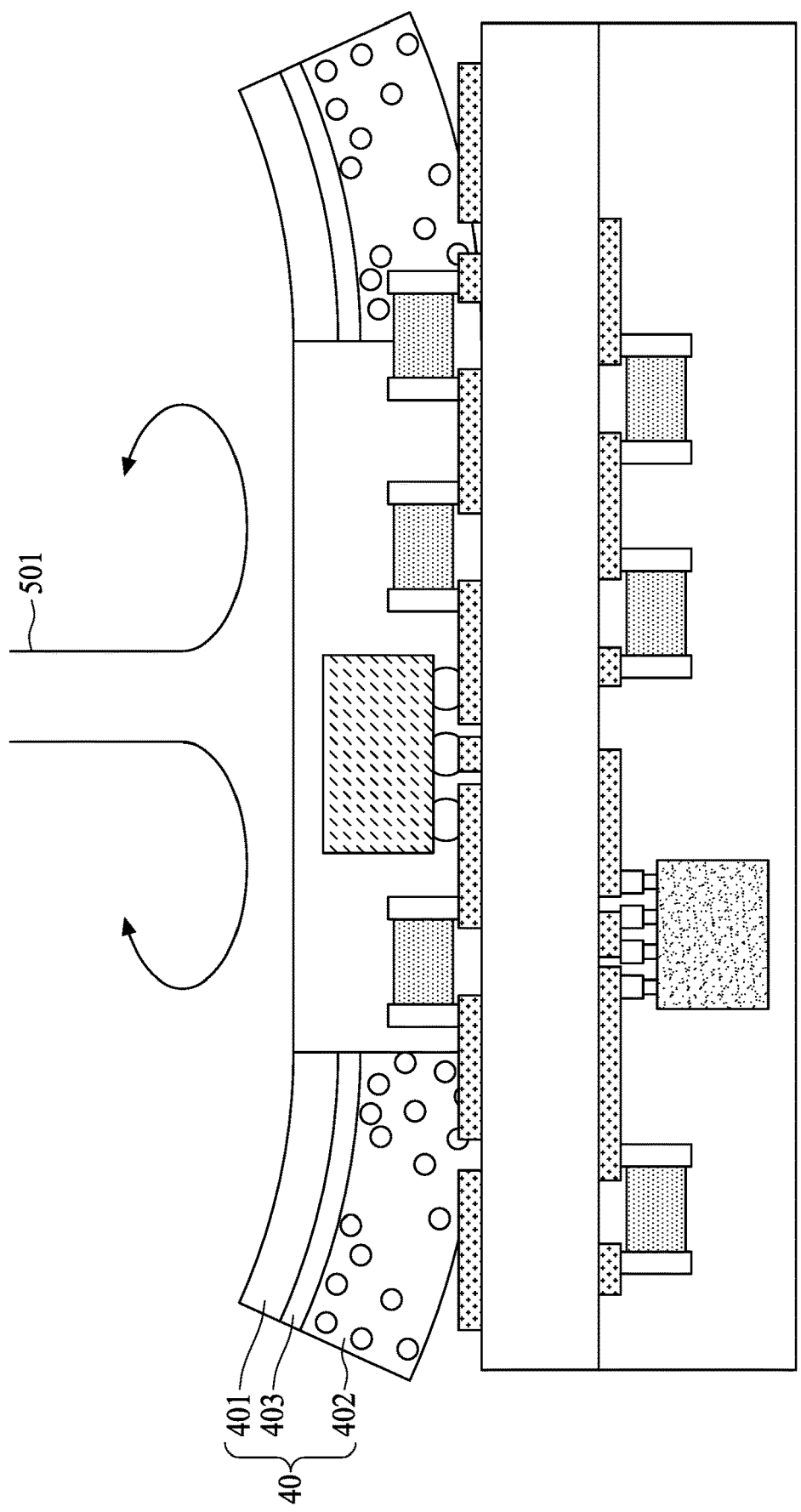

Referring to FIG. 9G, the temperature of the removable member 40 is lowered, for example, by introducing a cool air flow 501 at a lower temperature (compared with the ambient temperature or the temperature of the removable member 40) to lower the temperature of the removable member 40. In some embodiments, since the CTE of the first material 401 is greater than the CTE of the second material 402, the removable member 40 bends upwardly at a lowered temperature and is slightly detached from a first surface 101 of the substrate 10 which makes it easy to remove the removable member 40.

In comparative embodiments, a space for accommodating the encapsulant 70 is defined by a mold. The mold contacts the top surface and lateral surface of the encapsulant 70. To successfully remove the mold after the formation of the encapsulant 70, a draft angle is specified. Therefore, an angle between the first surface 701 of the encapsulant 70 and a lateral surface of the encapsulant 70 would not be a right angle or an acute angle. In addition, since the mold directly contacts the substrate, the traces on the substrate may be damaged by the mold, and therefore, a spare surface area may be specified for the mold; electronic components may be cracked or damaged by the disposal and removal of the mold. In the embodiments according to the present disclosure, by using the removable member 40, it is unnecessary to use a mold which contacts the lateral surface of the resulting encapsulant, and therefore, the defects in the comparative embodiment can be avoided.

Figure 9H:
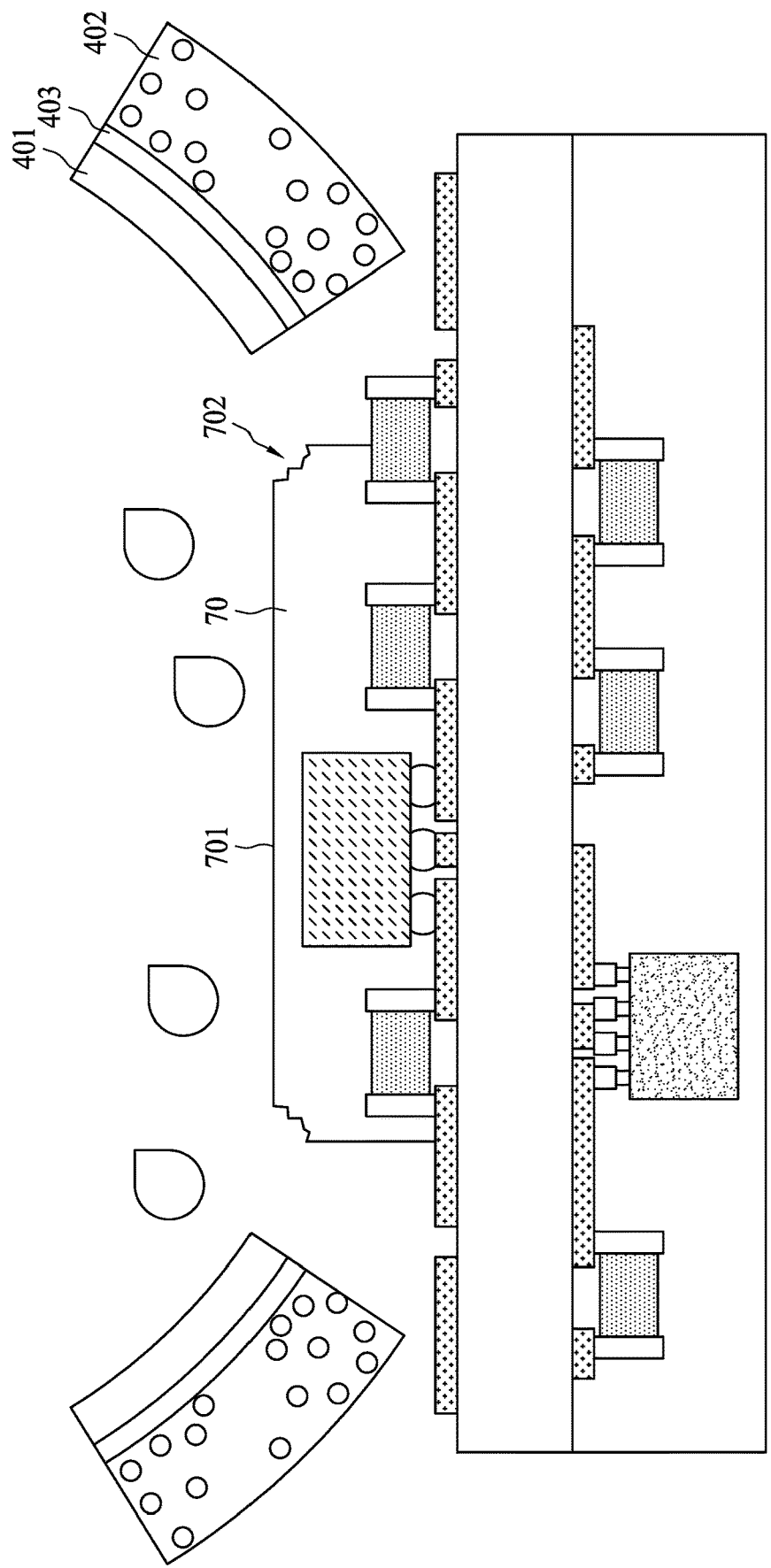

Referring to FIG. 9H, since the removable member 40 is disposed adjacent to the encapsulant 70 and bends upwardly after cooling, an edge of the first surface 701 of the encapsulant 70 may be damaged by the removable member 40 during the removal of the removable member 40 and then forms a recess 702 after the removal of the removable member 40.

A cleaning operation may be performed after the removal of the removable member 40, for example, by flushing the substrate 10. In some embodiments, the cleaning operation may be carried out during or before the removal the removable member 40.

Figure 9I:
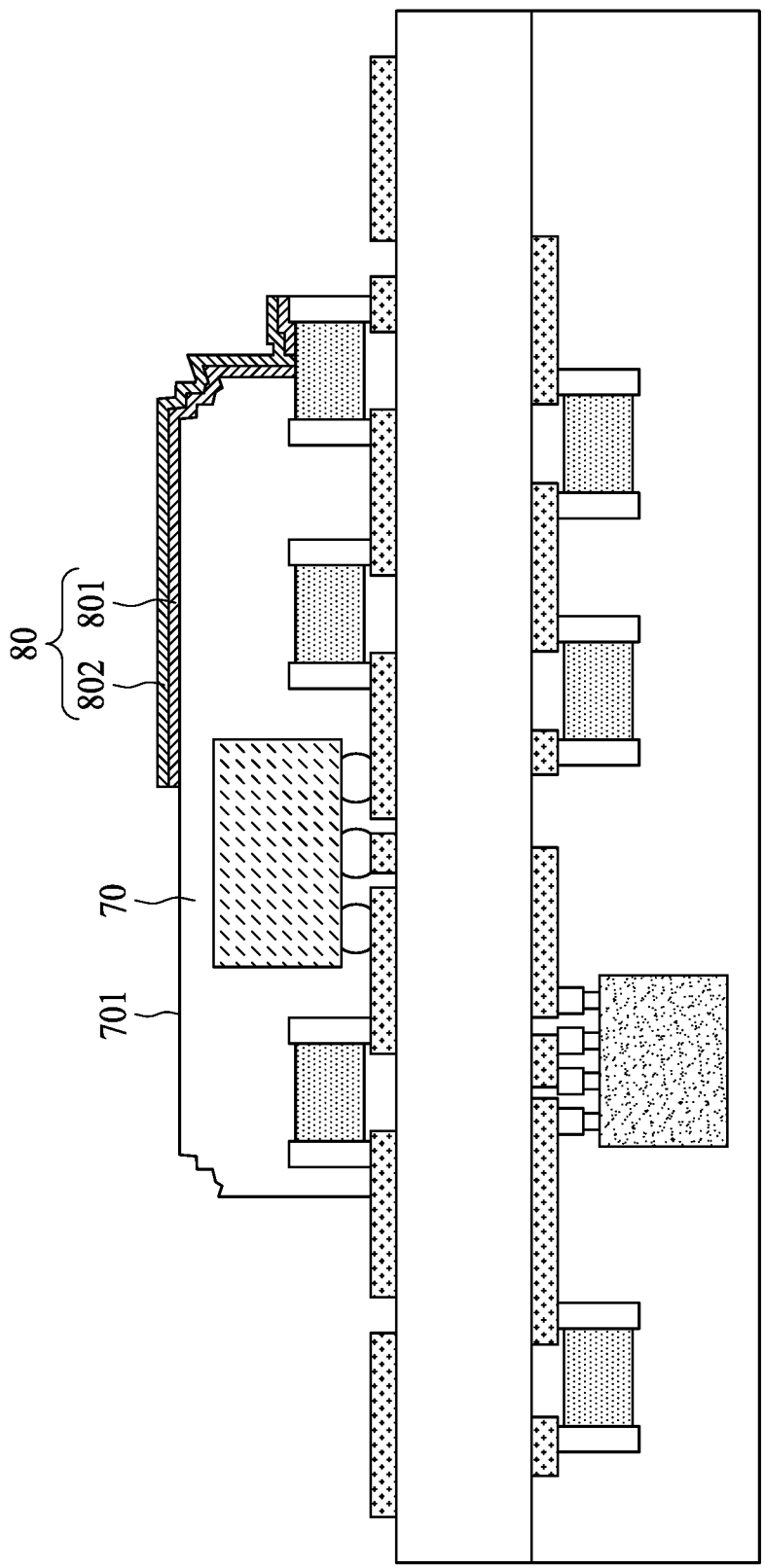

Referring to FIG. 9I, after the removal of the removable member 40 from the substrate 10, a conductive wire 80 or a patterned conductive layer 80 is disposed on a portion of the first surface 701 of the encapsulant 70 and extends along the recess 702 to a lateral surface of the encapsulant 70. In some embodiments, the conductive wire 80 or patterned conductive layer 80 includes a patterned seed layer 801 and a patterned conductive layer 802. A seed layer may be formed, for example, by sputtering and then a conductive layer may be formed, for example, by physical vapor deposition (PVD). Next, the seed layer and conductive layer are patterned in a lithographic etching operation by using a photoresist to define the pattern.

Figure 9J:
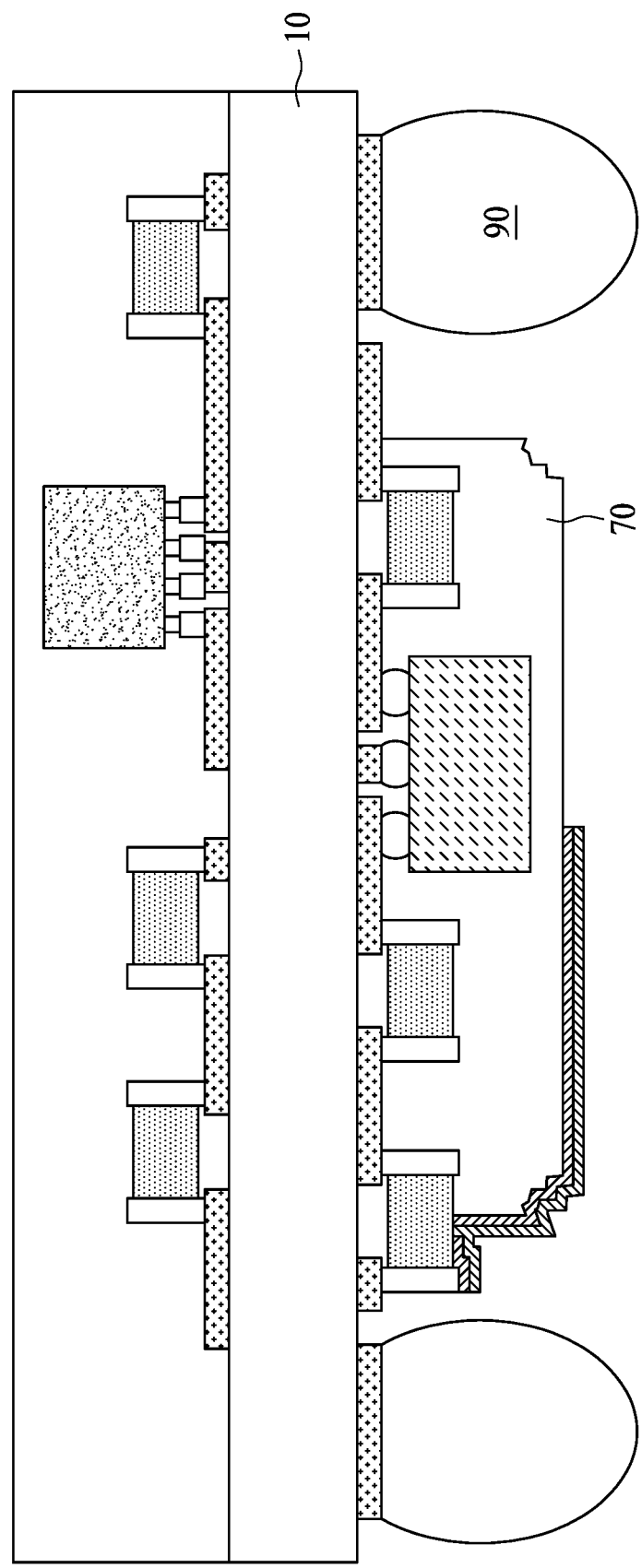

Referring to FIG. 9J, a conductive member 90 is disposed on the patterned conductive layer 88. In some embodiments, the conductive member 90 may include a solder ball or bump. Next, a semiconductor device package 1 is obtained.

Figure 10:
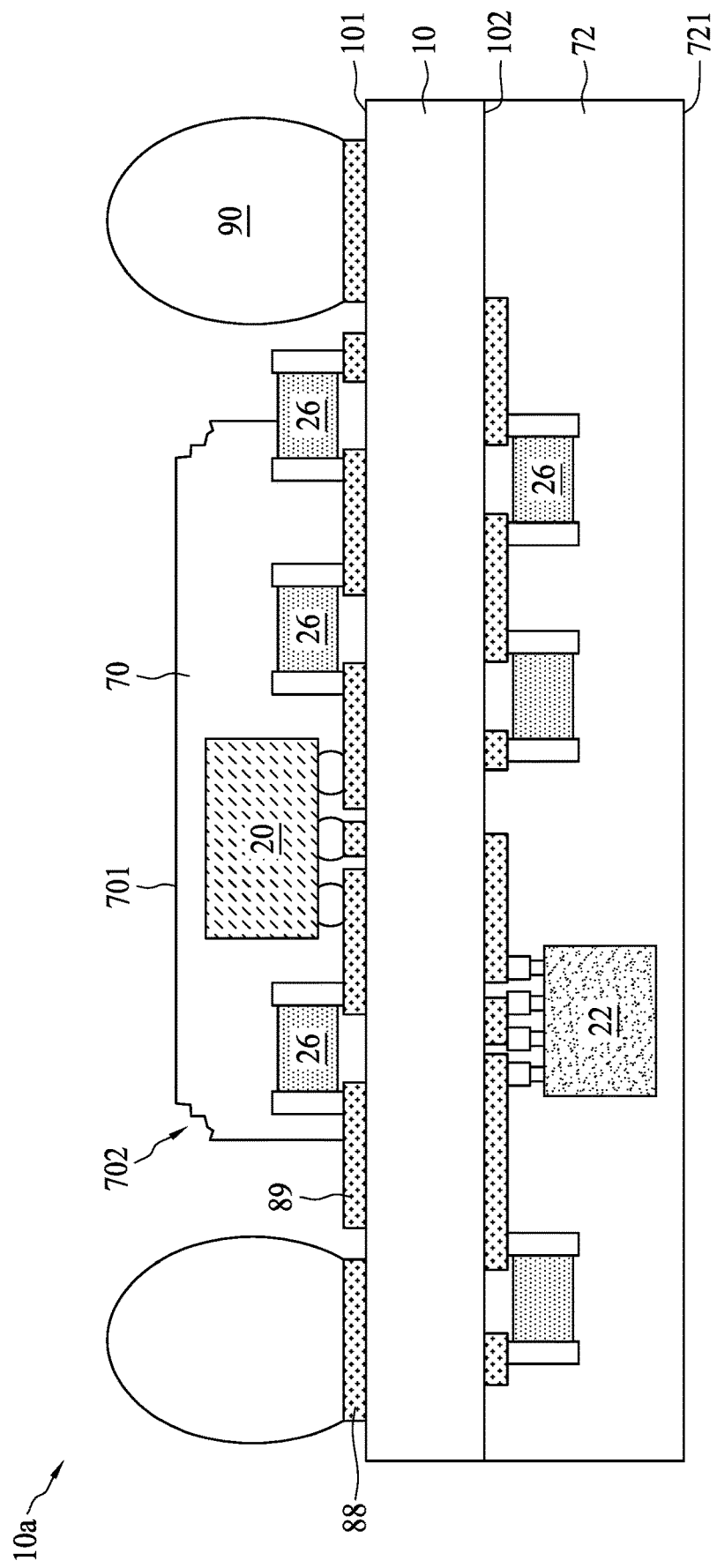
FIG. 10 illustrates a semiconductor device package in accordance with some embodiments of the present disclosure.

FIG. 10 illustrates a semiconductor device package 10a in accordance with some embodiments of the present disclosure. The semiconductor device package 10a is similar to the semiconductor device package 1 except that the semiconductor device package 10a does not include the conductive wire 80 or patterned conductive layer 80.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a substrate having a first surface and a second surface opposite to the first surface;
   a first electronic component disposed on the first surface of the substrate; and
   a first encapsulant disposed on the first surface of the substrate and covering the first electronic component, wherein the first encapsulant has a first surface facing away the first surface of the substrate and the first encapsulant comprises a concave at an edge of the first surface of the first encapsulant, wherein the first encapsulant covers a first portion of the first electronic component and exposes a second portion of the first electronic component.

2. The semiconductor device package according to claim 1, further comprising a second electronic component disposed on the second surface of the substrate.

3. The semiconductor device package according to claim 2, wherein the second electronic component is covered by a second encapsulant.

4. The semiconductor device package according to claim 1, further comprising a conductive wire or a patterned conductive layer disposed along and in contact with the first surface of the first encapsulant and a lateral surface of the first encapsulant.

5. The semiconductor device package according to claim 4, wherein the conductive wire or the patterned conductive layer is electrically connected to the first electronic component.

6. The semiconductor device package according to claim 4, wherein the first electronic component is electrically connected to a third electronic component through a conductive wire or the patterned conductive layer.

7. The semiconductor device package according to claim 6, wherein the third electronic component includes an antenna.

8. The semiconductor device package according to claim 4, wherein the conductive wire or the patterned conductive layer contacts the first electronic component.

9. The semiconductor device package according to claim 1, wherein an angle between the first surface of the first encapsulant and a lateral surface of the first encapsulant is a right angle or an acute angle.

10. The semiconductor device package according to claim 1, wherein an angle between the first surface of the first encapsulant and a lateral surface of the first encapsulant is an obtuse angle.

11. The semiconductor device package according to claim 1, wherein the first encapsulant is disposed on a first region of the first surface of the first substrate and the semiconductor device package further comprises a conductive member or an electronic component disposed on a second region of the first surface of the first substrate and not covered by the first encapsulant.

12. A semiconductor device package, comprising:
a substrate having a first surface and a second surface opposite to the first surface;
a first electronic component disposed on the first surface of the substrate;
a first encapsulant disposed on the first surface of the substrate, wherein the first encapsulant covers a first portion of the first electronic component and exposes a second portion of the first electronic component,
wherein the first encapsulant has a first surface facing away the first surface of the substrate and the first encapsulant comprises a recess at an edge of the first surface of the first encapsulant; and
a second encapsulant covering the first encapsulant and the second portion of the first electronic component.

13. The semiconductor device package according to claim 12, further comprising a first patterned conductive layer on the first surface of the first encapsulant, wherein a first portion of the first patterned conductive layer is covered by the second encapsulant and a second portion of the first patterned conductive layer is exposed from the second encapsulant.

14. The semiconductor device package according to claim 13, further comprising a second electronic component and a third electronic component disposed on the first surface of the first encapsulant, wherein the second electronic component is exposed from the second encapsulant and the third electronic component is covered by the second encapsulant.

15. The semiconductor device package according to claim 14, further comprising a second patterned conductive layer formed on the second encapsulant and electrically connected to the second electronic component through the first patterned conductive layer.

16. The semiconductor device package according to claim 12, wherein a first portion of the first surface of the first encapsulant is in contact with the second encapsulant and a second portion of the first surface of the first encapsulant is exposed from the second encapsulant.

17. A semiconductor device package, comprising:
a substrate having a first surface and a second surface opposite to the first surface;
a first electronic component disposed on the first surface of the substrate;
a first encapsulant disposed on the first surface of the substrate and covering the first electronic component, wherein the first encapsulant has a first surface facing away the first surface of the substrate and the first encapsulant comprises a concave at an edge of the first surface of the first encapsulant, and wherein the first encapsulant covers a first portion of the first electronic component and exposes a second portion of the first electronic component; and
a conductive wire or a patterned conductive layer disposed along and in contact with the first surface of the first encapsulant and a lateral surface of the first encapsulant, wherein the conductive wire or the patterned conductive layer contacts the first electronic component.

18. The semiconductor device package according to claim 17, wherein the first electronic component is electrically connected to a third electronic component through a conductive wire or the patterned conductive layer.

* * * * *